United States Patent
Libera et al.

(10) Patent No.: US 6,340,828 B1
(45) Date of Patent: Jan. 22, 2002

(54) PROCESS FOR MANUFACTURING NONVOLATILE MEMORY CELLS WITH DIMENSIONAL CONTROL OF THE FLOATING GATE REGIONS

(75) Inventors: Giovanna Dalla Libera, Monza; Bruno Vajana, Bergamo; Matteo Patelmo, Trezzo Sull'Adda, all of (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 09/587,377

(22) Filed: Jun. 1, 2000

Related U.S. Application Data

(63) Continuation-in-part of application No. 09/426,094, filed on Oct. 22, 1999.

(30) Foreign Application Priority Data

Oct. 23, 1998 (EP) .............................. 98830644
Jun. 4, 1999 (EP) .............................. 99830346

(51) Int. Cl.[7] ...................... H01L 29/778; H01L 21/336
(52) U.S. Cl. ....................................... 257/321; 438/264
(58) Field of Search ............................... 257/314, 315, 257/316, 321, 365; 438/257, 258, 261, 264, 265, 283, 299, 303, 266

(56) References Cited

U.S. PATENT DOCUMENTS 5,386,132 A * 1/1995 Wong
5,472,887 A 12/1995 Hutter et al.
5,554,551 A * 9/1996 Hong
5,859,453 A * 1/1999 Ahn

FOREIGN PATENT DOCUMENTS

EP 0 216 053 4/1987
EP 0 811 983 12/1997
JP 09 283643 10/1997

OTHER PUBLICATIONS

Shiba and Kubota, "Downscaling of Floating–Gate EEPROM Modules for ASIC Applications," *Electronics and Communications in Japan,* Part 2 75(12): 67–76, 1992.
Wolf, Stanley and Richard N. Tauber, *Silicon Processing for the VLSI Era,* vol. 3, Lattice Press, Sunset Beach, California, 1986, pp. 608–611.

* cited by examiner

*Primary Examiner*—Charles Bowers
*Assistant Examiner*—Evan Pert
(74) *Attorney, Agent, or Firm*—Lisa K. Jorgenson; E. Russell Tarleton; Seed IP Law Group PLLC

(57) ABSTRACT

A manufacturing process including forming a first insulating region on top of an active area; forming a tunnel region laterally to the first insulating region; forming a floating gate region; sealing the floating gate region with an insulating region; forming a control gate region on top of the floating gate region; and forming conductive regions in the active area. The floating gate region is obtained by depositing and defining a semiconductor material layer through a floating gate mask. The floating gate mask has an opening with an internally delimiting side extending at a preset distance from a corresponding externally delimiting side of the mask, and the semiconductor material layer is removed laterally at the external and internal delimiting sides so that the tunnel area's length is defined, by the floating gate mask alone.

20 Claims, 18 Drawing Sheets

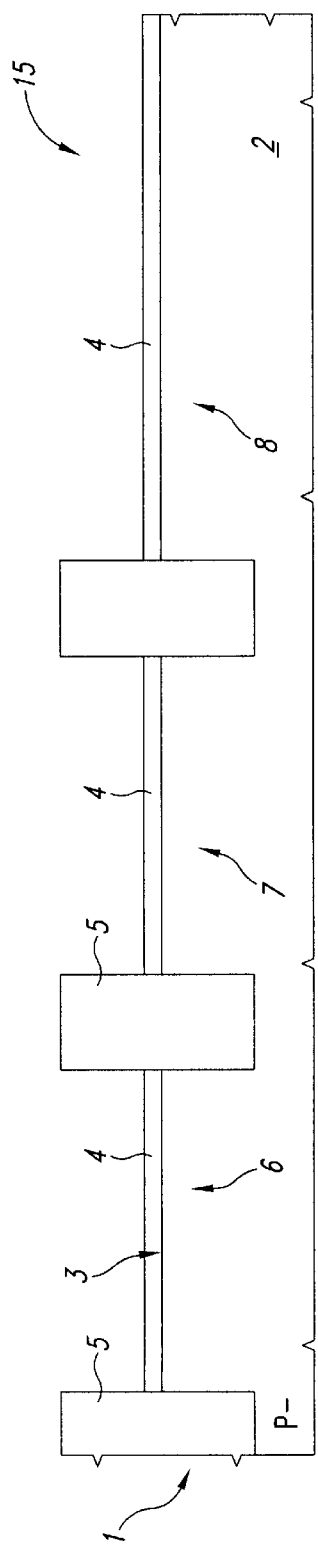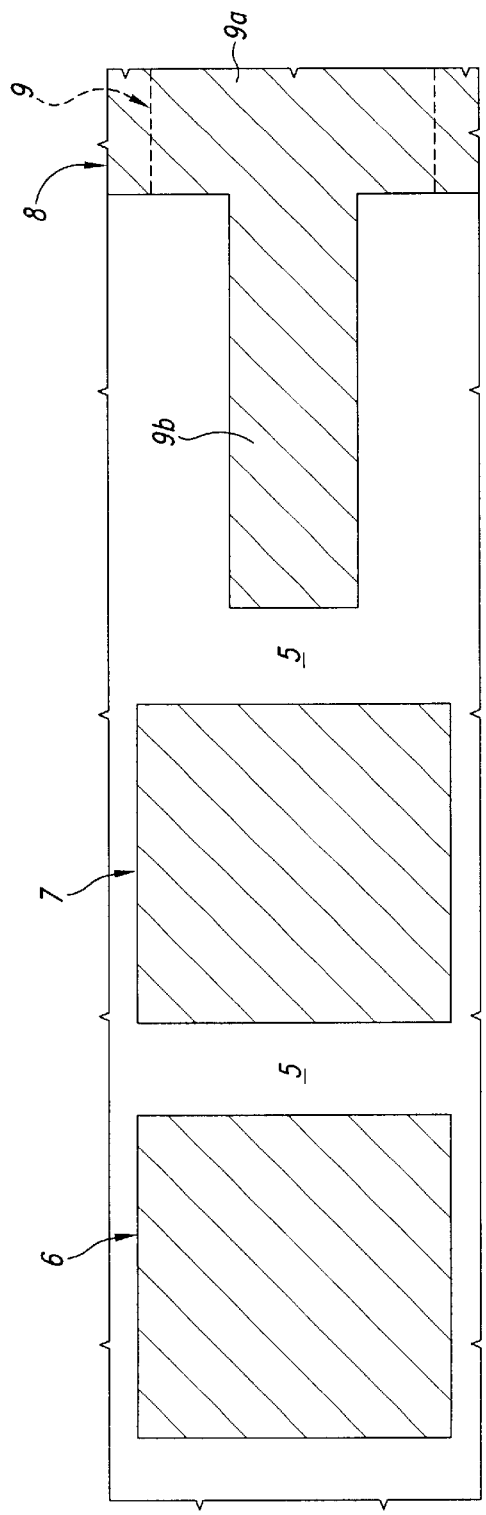

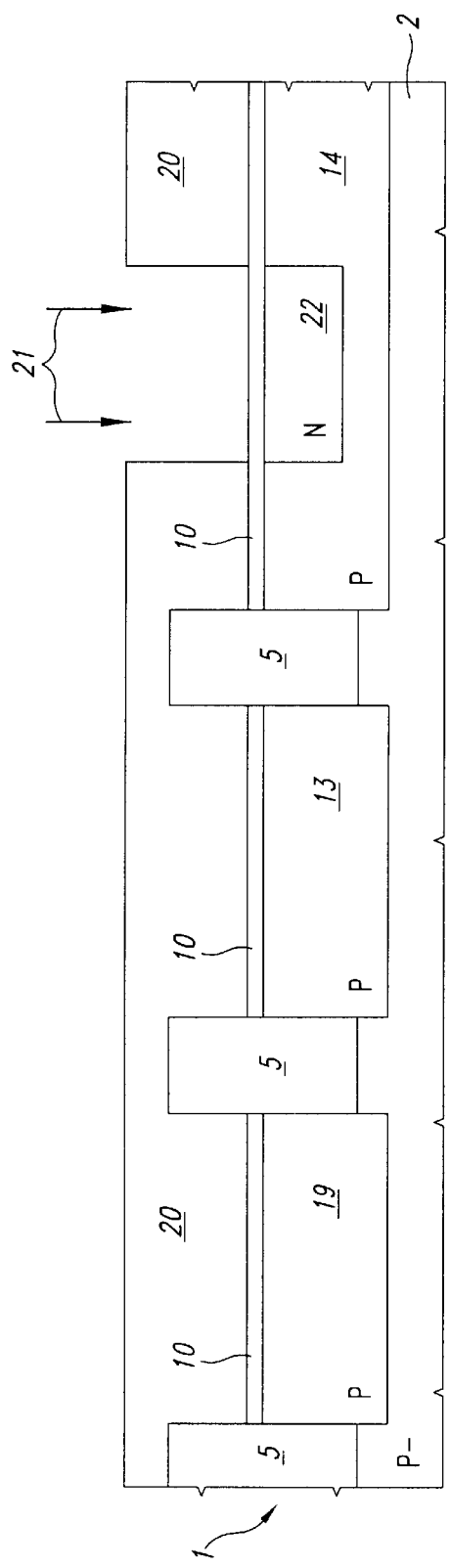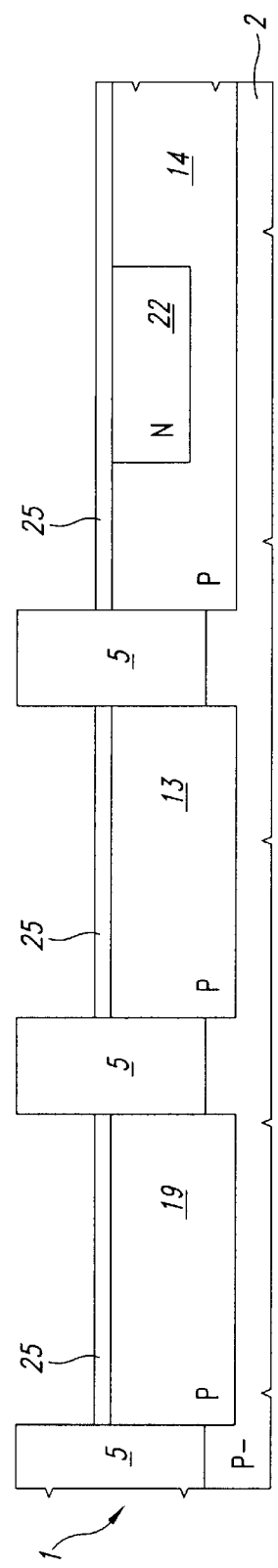

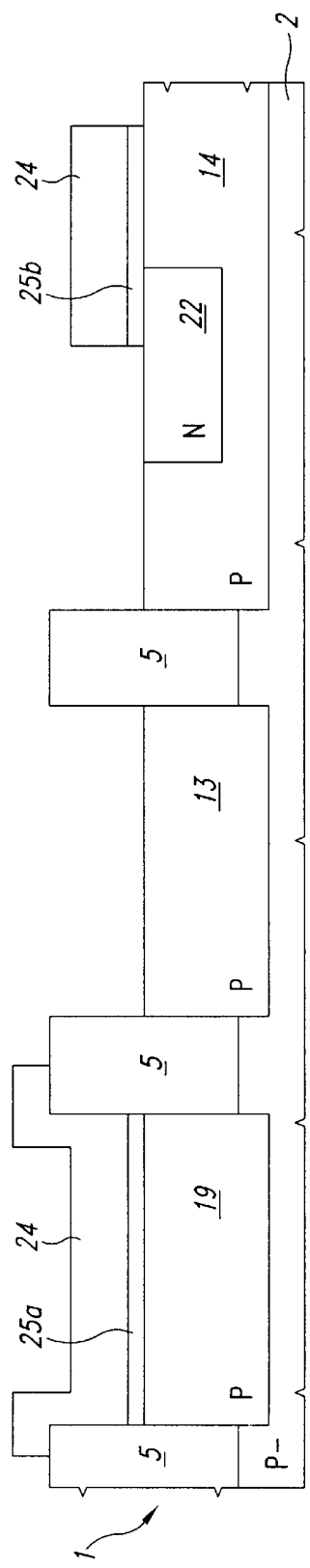
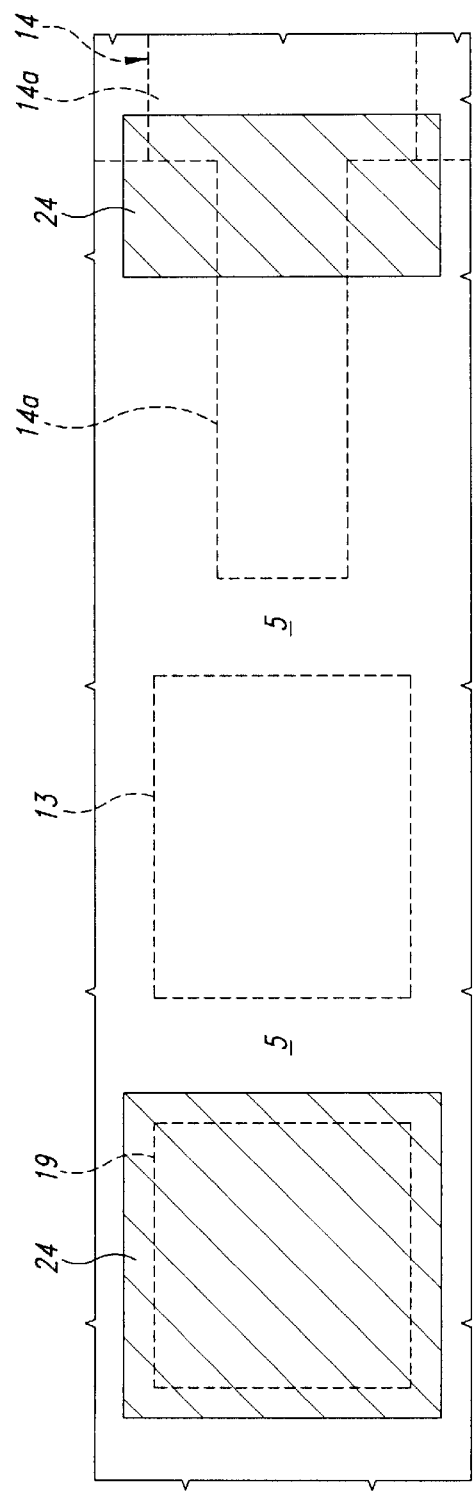
Fig. 7
Fig. 8

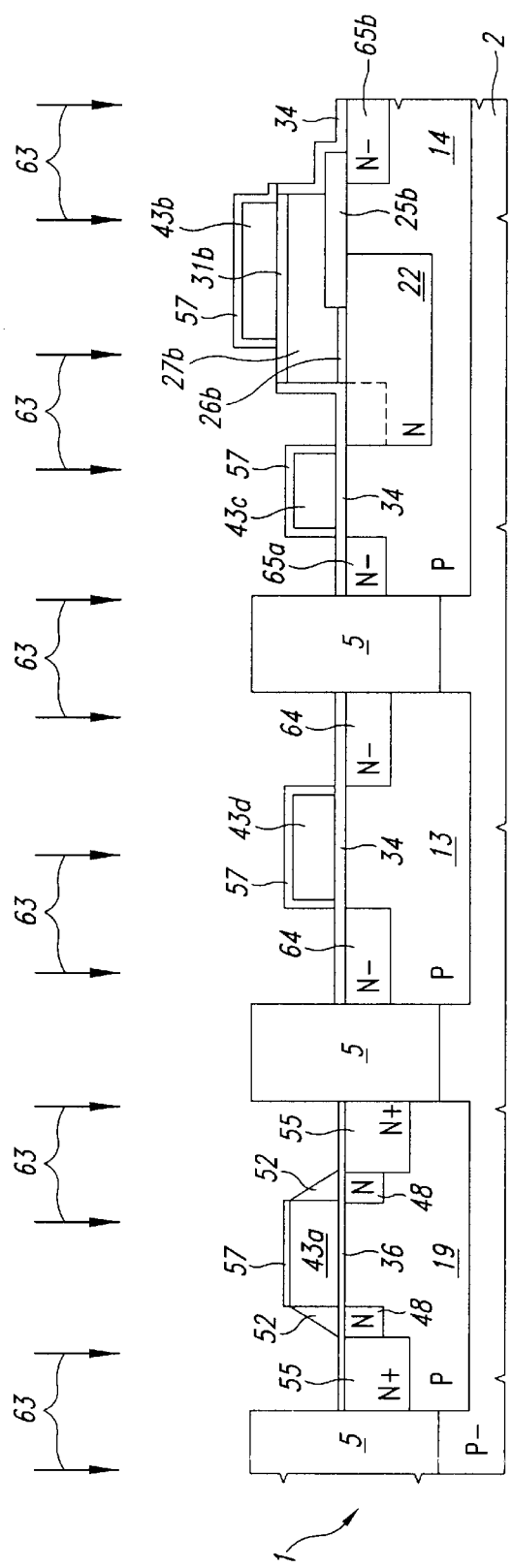
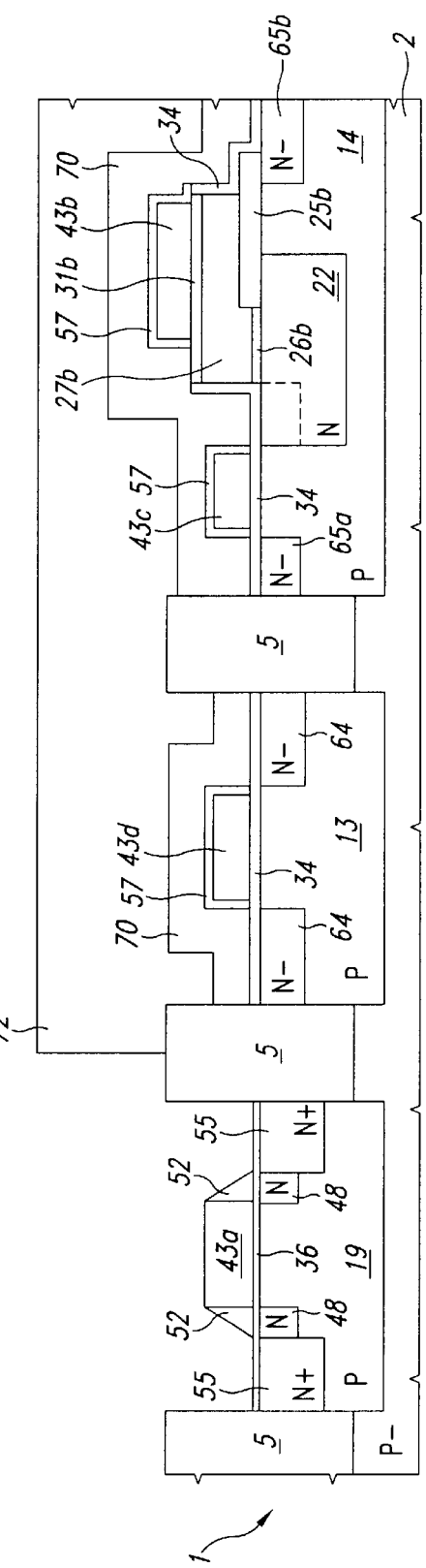
Fig. 23
Fig. 24

PROCESS FOR MANUFACTURING NONVOLATILE MEMORY CELLS WITH DIMENSIONAL CONTROL OF THE FLOATING GATE REGIONS

CROSS REFERENCE TO RELATED APPLICATION

This application is a continuation-in-part of U.S. patent application Ser. No. 09/426,094, filed Oct. 22, 1999.

TECHNICAL FIELD

The present invention regards a process for manufacturing electronic devices, and more particularly, for manufacturing nonvolatile memory cells with dimensional control of the floating gate regions.

BACKGROUND OF THE INVENTION

Devices using nonvolatile memories of the EEPROM type, such as smart cards, complex microcontrollers, and mass storage devices requiring programmability of the single byte, call for increasingly higher levels of performance and reliability.

In practice, from the technological standpoint, this means that it is necessary to get high levels of performance (i.e., increasingly thinner tunnel oxides, ever more reduced programming voltages, increasingly greater current driving capability of the cells) to coexist with an extremely high reliability: one hundred thousand programming cycles and retention of the stored charge for at least ten years are by now considered the minimum requisites for the acceptance of this type of product on the market.

According to the above, it is necessary to develop new manufacturing processes and new geometries that are able to eliminate some of the critical aspects typical of memories, thus increasing their intrinsic reliability without reducing their performance, both for embedded applications (i.e., wherein the memory cells are associated with special electronic devices) and for stand-alone applications (i.e., wherein the device is merely a nonvolatile memory).

SUMMARY OF THE INVENTION

The disclosed embodiments of the present invention provide a manufacturing process that enables the critical aspects of known processes to be reduced.

According to the embodiments of the present invention, there are provided a process for manufacturing electronic devices comprising nonvolatile memory cells and an electronic device comprising nonvolatile memory cells. This process includes forming a floating gate region on a semiconductor material by depositing and defining a semiconductor material layer through a floating gate mask having an opening with an internally delimiting side extending a preset distance from a corresponding externally delimiting side of the mask; and forming a control gate region on top of the floating gate region.

In accordance with another embodiment of the invention, a process for manufacturing electronic devices having floating gate nonvolatile cells includes: defining an active area in a substrate of semiconductor material; forming a first insulating region on top of the active area; depositing a first dielectric material layer on top of the substrate, the first dielectric material layer comprising a tunnel area; forming a floating gate region on top of the first dielectric material layer and on top of the first insulating region that includes depositing a first semiconductor material layer on top of the first dielectric material layer and selectively removing the first semiconductor material layer using a floating gate mask having an externally delimiting side, the floating gate mask having an opening with an internally delimiting side facing the externally delimiting side at a preset distance so that the semiconductor material layer is removed laterally to the externally and internally delimiting sides; forming a second insulating region surrounding the floating gate region; forming a control gate region on top of the floating gate region; and forming conductive regions in the active area.

BRIEF DESCRIPTION OF THE DRAWINGS

To help understanding of the present invention, a preferred embodiment is now described, purely by way of non-limiting example, with reference to the attached drawings, in which:

FIG. 1 shows a cross-section of a silicon wafer in a first step of a production method;

FIG. 2 is a plan view of the wafer of FIG. 1;

FIGS. 3–7 show cross-sections similar to that of FIG. 1, in successive production steps;

FIG. 8 is a plan view of the wafer of FIG. 7;

FIGS. 23–25 show cross-sections similar to that of FIG. 21, in successive production steps;

DETAILED DESCRIPTION OF THE INVENTION

Figure 3:
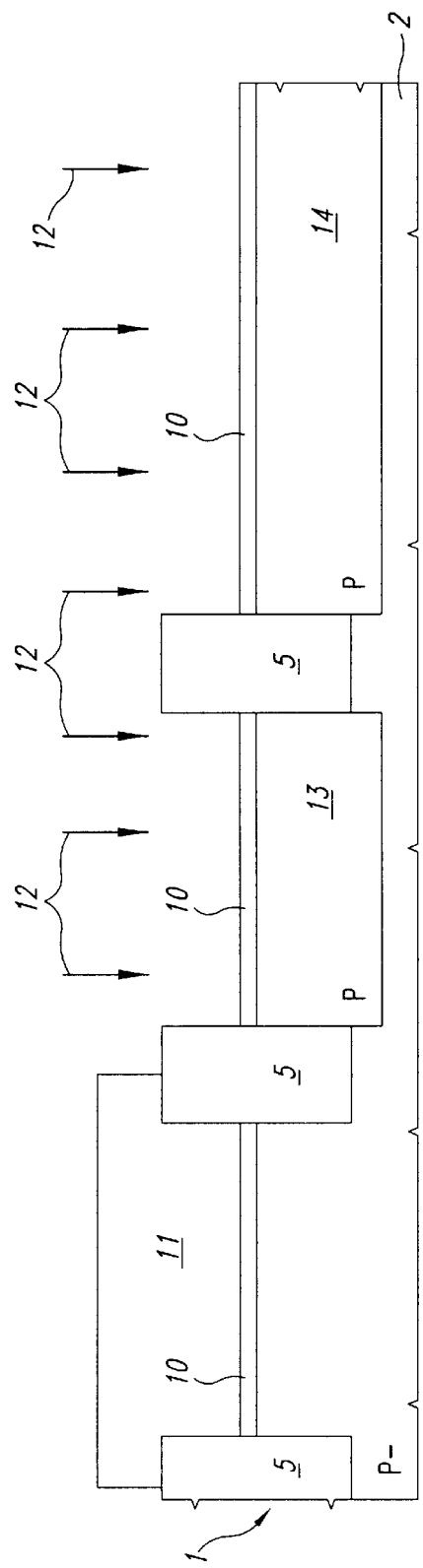

To help understanding of the present invention, a production method subject of U.S. patent application Ser. No. 09/426,094, filed on Oct. 22, 1999, of which this application is a continuation-in-part, is initially described with reference to FIGS. 1 to 25. In detail, this method makes it possible to produce a device comprising LV (low-voltage and high-speed) and HV (high-voltage) NMOS transistors, LV and HV PMOS transistors, and EEPROM memory cells formed by a selection transistor and a memory transistor.

In particular, owing to the duality in forming NMOS and PMOS transistors, the drawings show only the steps for NMOS transistors, and the steps for forming PMOS transistors are described in words alone. The EEPROM memory cells form a memory array, and are produced in a part of the wafer thereafter also designated as matrix area 15.

In FIG. 1, a wafer 1 formed by a monocrystalline silicon substrate 2, here of P type, has been subjected to the active area definition steps. In detail, with the surface 3 of the substrate 2 covered by an active area mask 4 of non-oxidizable material (typically of a double layer of silicon oxide and silicon nitride, defined using resist), wafer 1 has been subjected to thermal oxidation; consequently, in the parts of the substrate 2 not covered by the active area mask 4, a thick oxide layer (field oxide 5) has been grown, delimiting between each other active areas of the substrate, designed to accommodate various components of the device to be produced. In particular, FIG. 1 shows three active areas, i.e., a LV active area 6, designed to accommodate a LV NMOS transistor, an HV active area 7, designed to accommodate an HV NMOS transistor, and a portion of active matrix area (top view) 8, designed to accommodate EEPROM memory cells.

In detail, and in a known manner, the active matrix area 15 defines a grid, of which FIG. 2 shows in full only the part relative to one cell, indicated at 9, having substantially the shape of a "T" rotated by 90°, and comprises a leg 9a and a cross-piece 9b. The leg 9a is adjacent to, and electrically connected to, respective legs 9a of other cells arranged above and below the shown cell, of which only parts are visible; in addition, the leg 9a is connected to a leg of an adjacent cell to the right (not shown), which has a symmetrical structure with respect to that shown. The legs 9a are designed to accommodate source regions of the memory transistors; the end of the cross-pieces 9b not connected to the legs 9a is designed to accommodate drain regions of the selection transistors, and the gate regions of the cells must be provided on the cross-pieces 9b. Further active areas are generally provided for forming LV or HV PMOS transistors, not shown in the drawings.

Subsequently, the active area mask 4 is removed, the free surface 3 of the substrate is oxidated to form a sacrificial oxide layer 10, and doping ions of N type are implanted through a mask, for forming N-HV regions (not shown) for the HV PMOS transistors; using an HV P-well resist mask 11, covering the entire surface of wafer 1, except active HV area 7 and matrix area 15, doping ions of P type are implanted, as shown schematically in FIG. 3 by arrows 12. In the substrate 2, P-HV regions 13 of P type for high-voltage transistors, and a P-matrix region 14, also of P type, for the cells are then formed, as shown in FIG. 3. The P-HV regions 13 and P-matrix regions 14 reproduce exactly the shape of the active HV area 7 and matrix area 15, and thus, for each cell, legs 14a (corresponding to legs 9a of active cell areas 9, see FIG. 8), and cross-pieces 14b (FIG. 8, corresponding to cross-pieces 9b) are defined.

Figure 4:
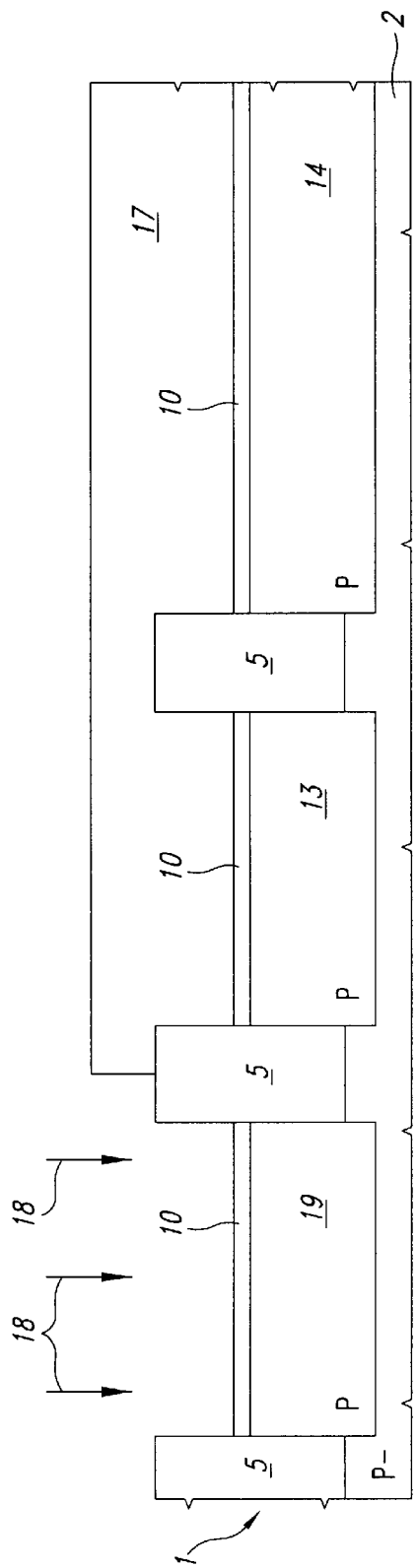

After removing the HV P-well mask 11, doping ions of N type are implanted through a mask for forming N-LV regions (not shown) for the LV PMOS transistors; then, using a LV P-well resist mask 17 covering the entire surface of the wafer 1, except active LV areas 6, doping ions of P type are implanted, as shown schematically in FIG. 4, by arrows 18. In the substrate 2, P-LV regions 19 of P type for the LV NMOS transistors are then formed, as shown in FIG. 4. Thereby, the P-HV region 13 and the P-LV regions 19 are separated from one another, and their electrical characteristics can be optimized with respect to the electrical characteristics required.

After removing the LV P-well mask 17, a capacitor mask 20 is formed, covering the entire surface of wafer 1, except strips perpendicular to cross-pieces 14b. Doping ions of N type (for example phosphorous) are then implanted, as shown schematically in FIG. 5 by arrows 21. In the cross-pieces 14b, continuity regions 22, of N type, are then formed, as necessary for electrical continuity between each selection transistor and the respective memory transistor of each cell. The structure of FIG. 5 is then obtained.

After removing the capacitor mask 20, the wafer 1 is subjected to annealing, the sacrificial layer 10 is removed, and matrix oxidation is carried out, forming a matrix oxide layer 25 on the surface of all regions 13, 14, and 19. Then, using a matrix oxide mask 24, shown in cross-section in FIG. 7 and in plan view in FIG. 8, the matrix oxide is removed from everywhere except from beneath the matrix oxide mask 24, forming a region 25b in the P-matrix region 14 that is partially arranged above the continuity region 22, and partially covers the leg 9a, and a masking region 25a on the P-LV region 19 (FIG. 7).

Figure 9:
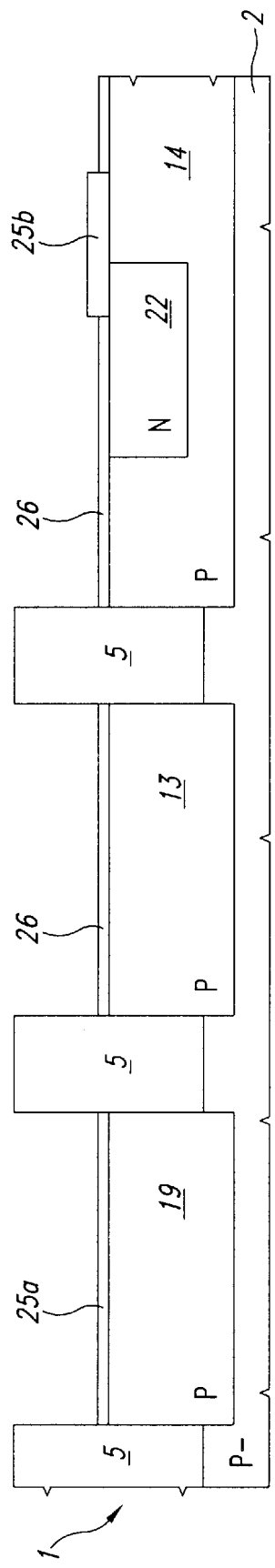
FIGS. 9–11 show cross-sections similar to that of FIG. 7, in successive production steps.

After removing the matrix oxide mask 24, wafer 1 is oxidized again, forming a tunnel oxide layer 26 on the entire surface of the substrate, where the latter is exposed, and increasing the thickness of the oxide that is already present (regions 25a, 25b) in regions 14 and 19. The structure of FIG. 9 is thus obtained.

Figure 10:
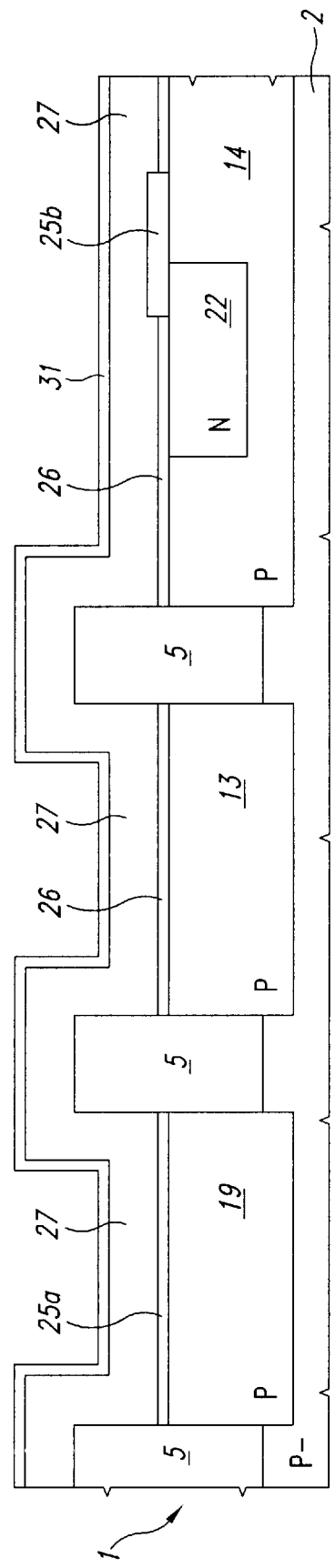

A first polycrystalline silicon layer is then deposited (poly1 layer 27), which is suitably doped; subsequently, an interpoly dielectric layer 31 is formed, for example of a triple layer of ONO (silicon oxide-silicon nitride-silicon oxide), as shown in FIG. 10.

Figure 11:
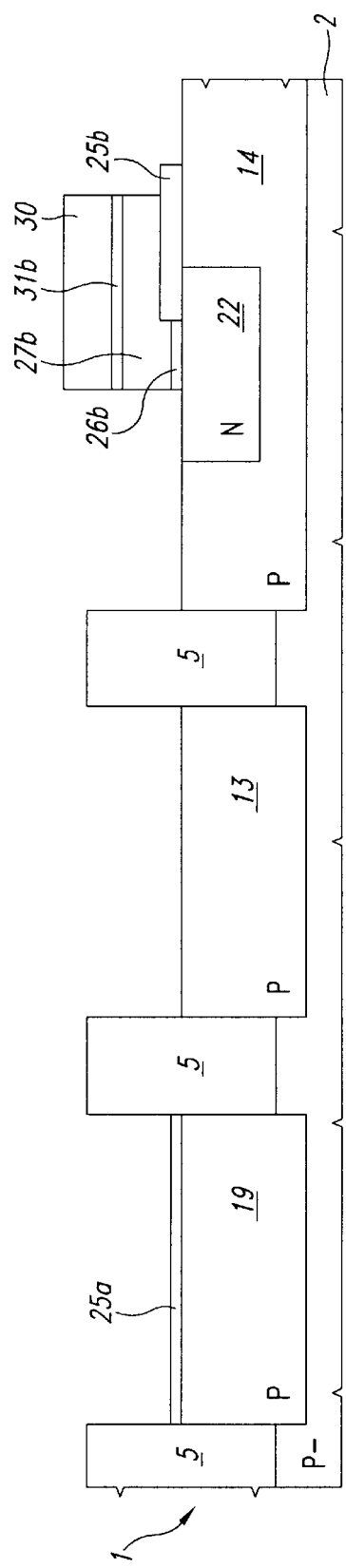
Figure 12:
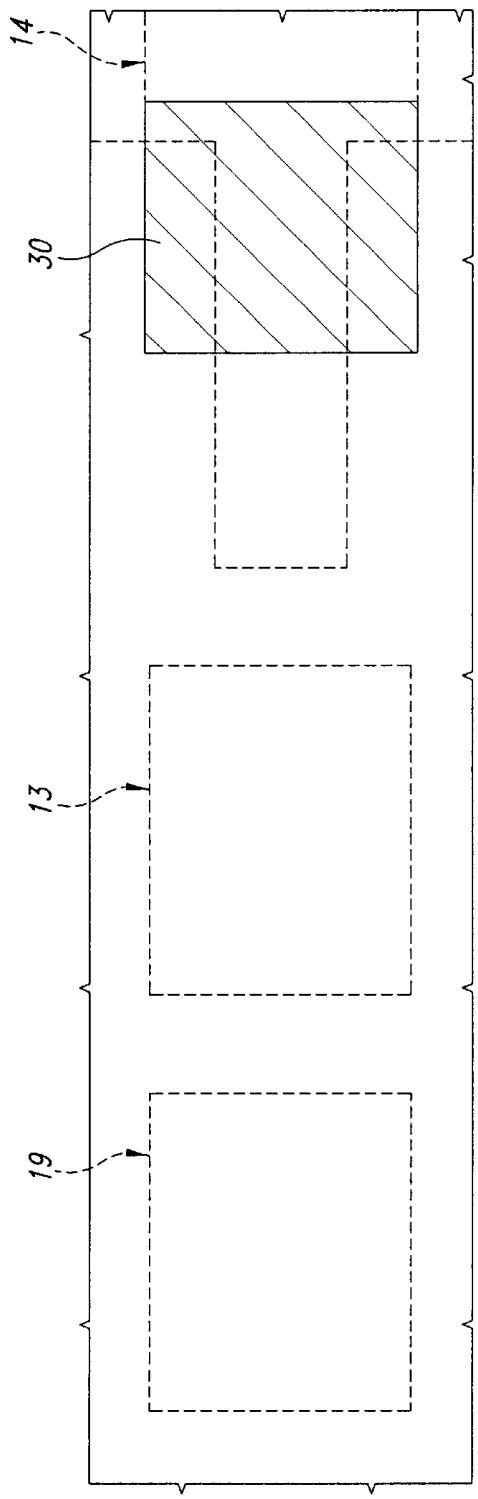
FIG. 12 is a plan view of the wafer of FIG. 11.

A floating gate mask 30 shown in FIG. 11 and 12 is then formed; dielectric layer 31, poly1 layer 27, and tunnel oxide layer 26 are then etched everywhere except where the floating gate regions of the memory transistors are to be formed, indicated at 27b in FIG. 11; consequently, of the tunnel oxide layer 26, only a tunnel region 26b is left, adjacent to an edge of the floating gate region 27b of the memory transistor. In this step, the thickness of the region 25a decreases again on the active area 19.

Figure 13:
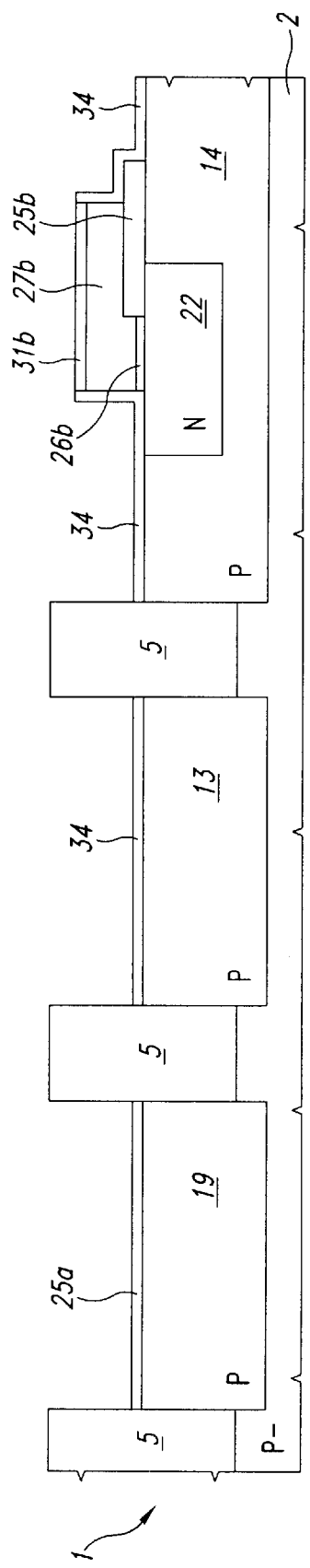
FIGS. 13–17 show cross-sections similar to that of FIG. 11, in successive production steps.
Figure 14:
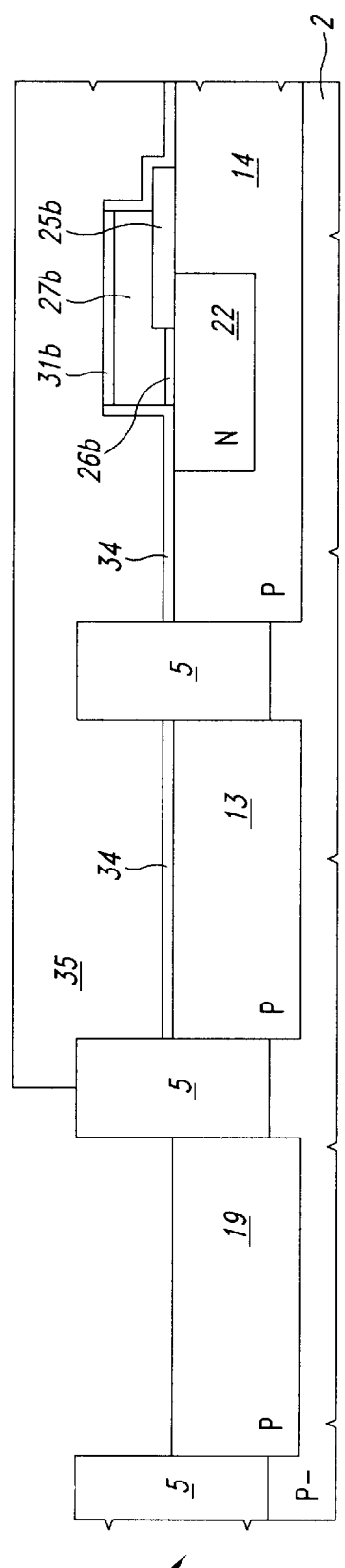

After removing the floating gate mask 30, an HV oxidation step is carried out, forming an HV gate oxide layer 34 on the entire free surface of substrate 2, in particular on P-HV regions 13 and P-matrix regions 14 (FIG. 13). Portions of oxide 34 are also formed laterally to the floating gate region 27b of the memory transistor, as shown in FIG. 13, and the thickness of the region 25a increases again. Subsequently, using an HV oxide resist mask 35, which covers the P-HV region 13 and the matrix area 15, the region 25a is removed from above the P-LV regions 19 (FIG. 14).

Figure 15:
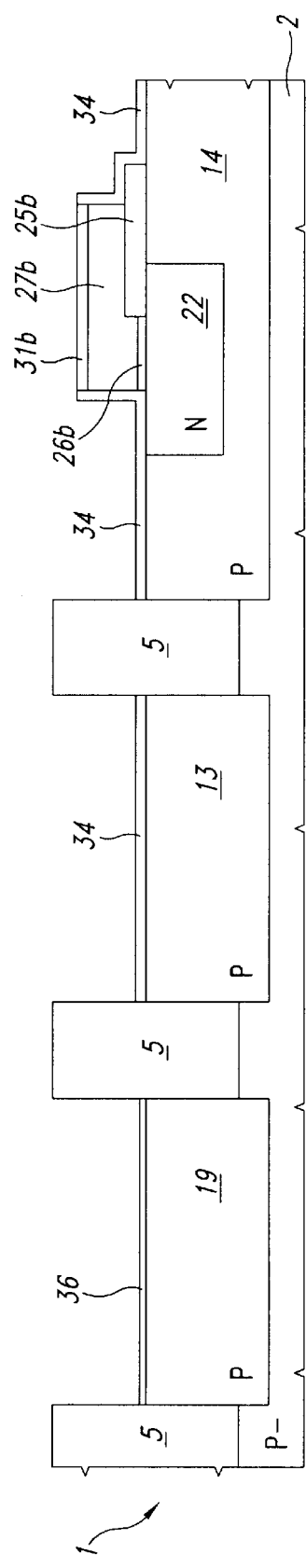

After removing the HV oxide mask 35, a LV oxidation step is carried out, forming a LV gate oxide layer 36 above the P-LV regions 19; in addition, the thickness of the HV gate oxide layer 34 increases above the P-HV region 13 and the P-matrix regions 14, thus providing the structure of FIG. 15.

Figure 16:
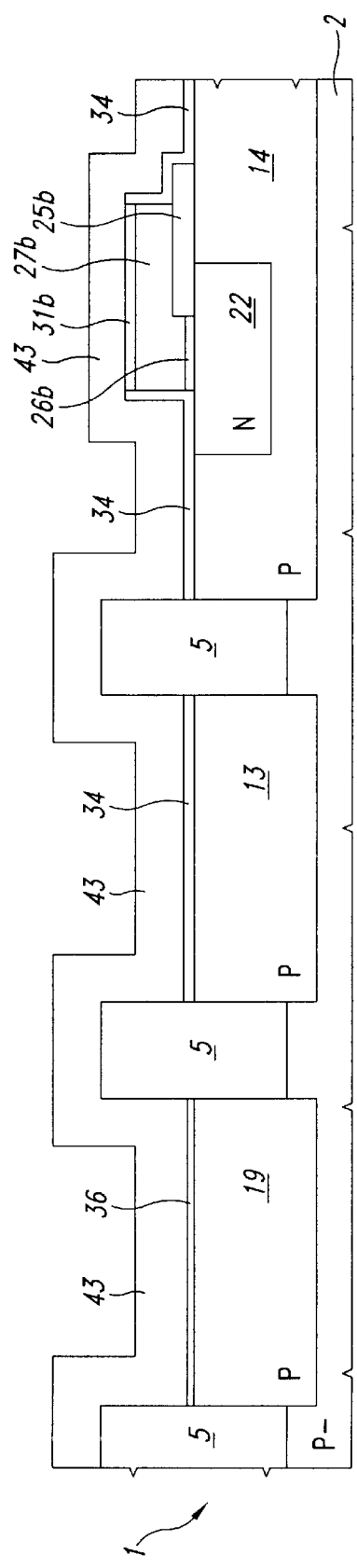
Figure 17:
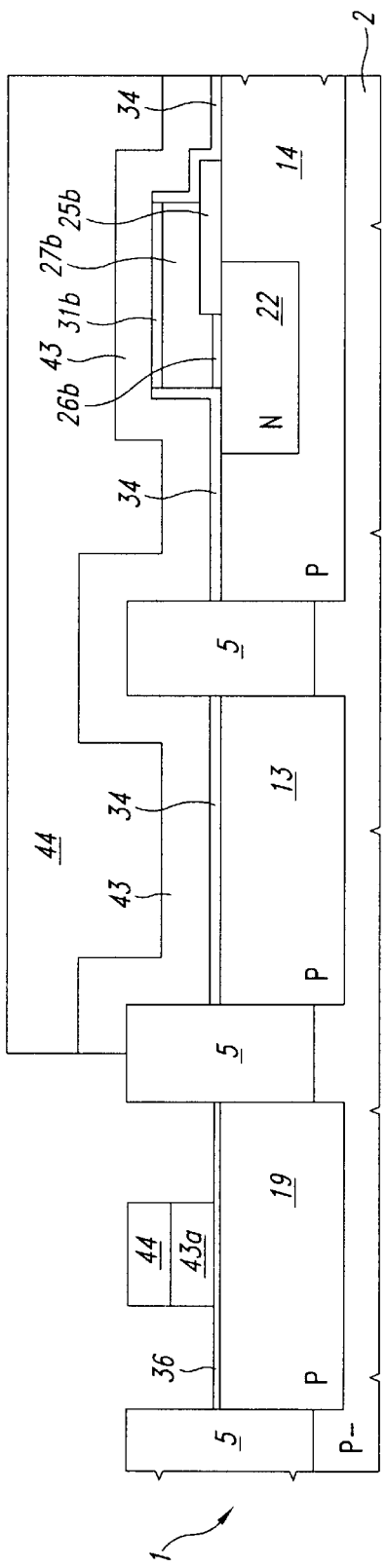
Figure 18:
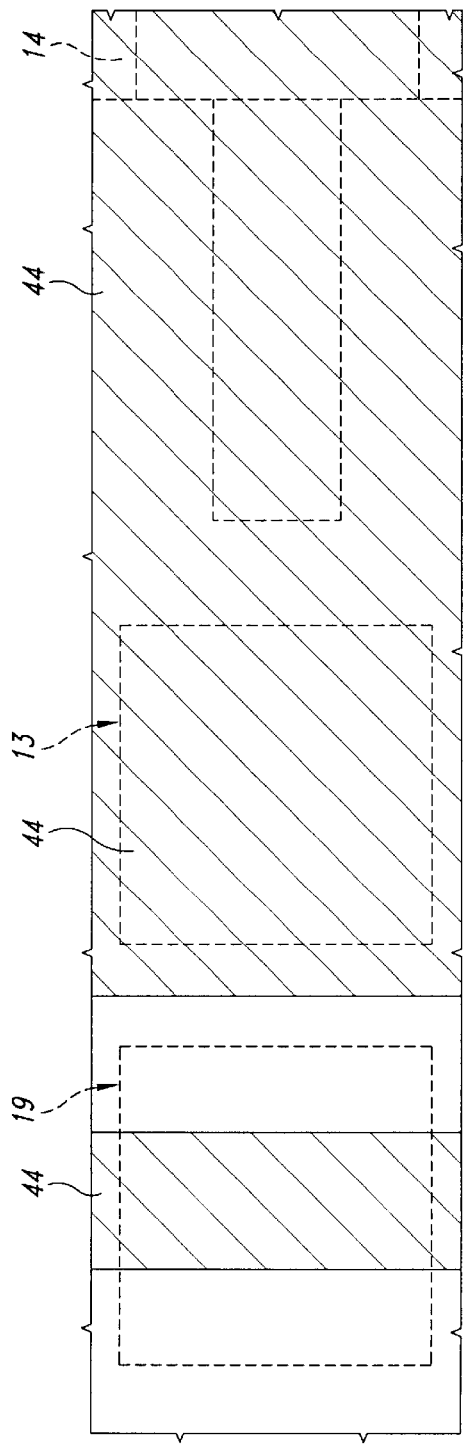
FIG. 18 is a plan view of the wafer of FIG. 17.

Then a second polycrystalline layer (non-doped poly2 layer 43) is deposited, as shown in FIG. 16. A LV gate mask 44 is formed, covering the N-HV regions (not shown), the P-HV regions 13, and the matrix area 15. In addition, the LV gate mask 44 covers the poly2 layer, above the P-LV regions 19, where both the NMOS and PMOS gate regions of the LV transistors must be defined, as shown in FIGS. 17 and 18, and above the N-LV regions (not shown) where the gate regions of the LV PMOS transistors must be defined. The exposed portions of the poly2 layer 43 are removed, thus providing the structure of FIG. 17, wherein the portions of poly2 remaining above P-LV regions 19 form gate regions 43a of the LV NMOS transistors. As can be seen, during the step of defining the gate regions of the LV transistors, the layers above the P-HV regions 13 and P-matrix regions 14 are protected, as are the layers above the N-HV regions (not shown); consequently, the method described provides separate definition of the gate regions of the LV transistors and HV transistors, as well as of the memory cells.

Figure 19:
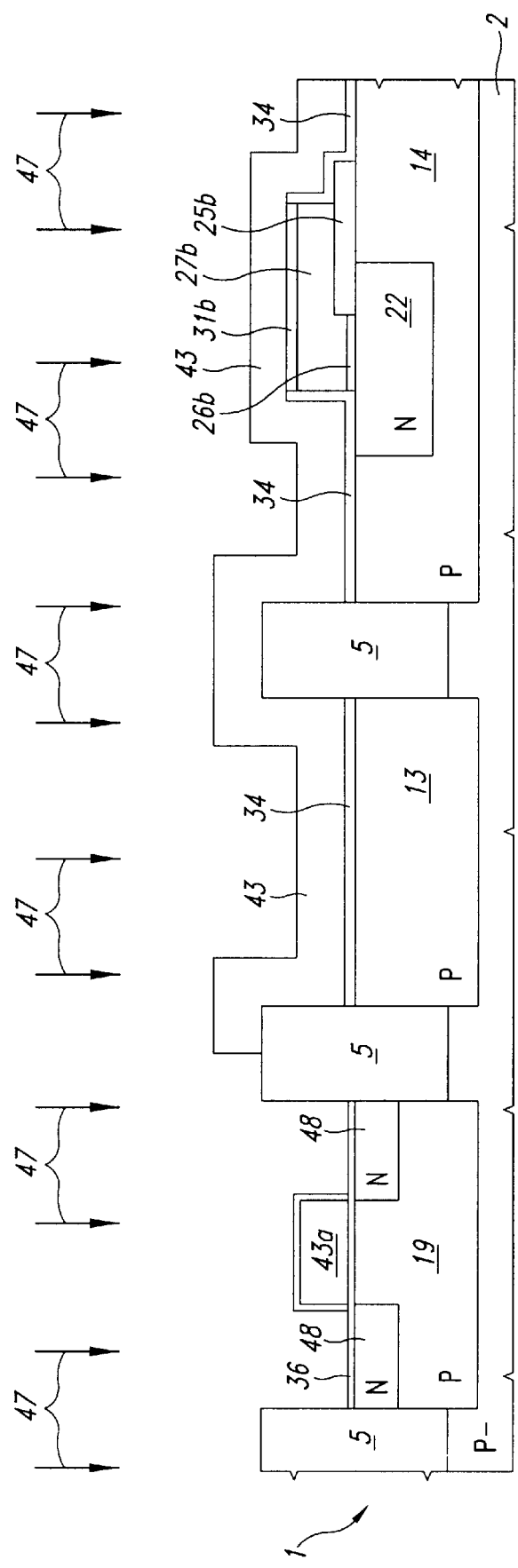
FIGS. 19–21 show cross-sections similar to that of FIG. 17, in successive production steps.

After removing the LV gate mask 44, and re-oxidation, to seal the gate regions 43a of the LV NMOS transistors, using a resist mask not shown, which covers the N-LV and N-HV regions, doping ions of N type are implanted (LDDN implanting), as shown in FIG. 19 by arrows 47. Laterally on the gate regions 43a (inside the P-LV regions 19), LDD regions 48 of N type are then formed; in addition, the poly2 layer 43 is suitably doped.

Figure 20:
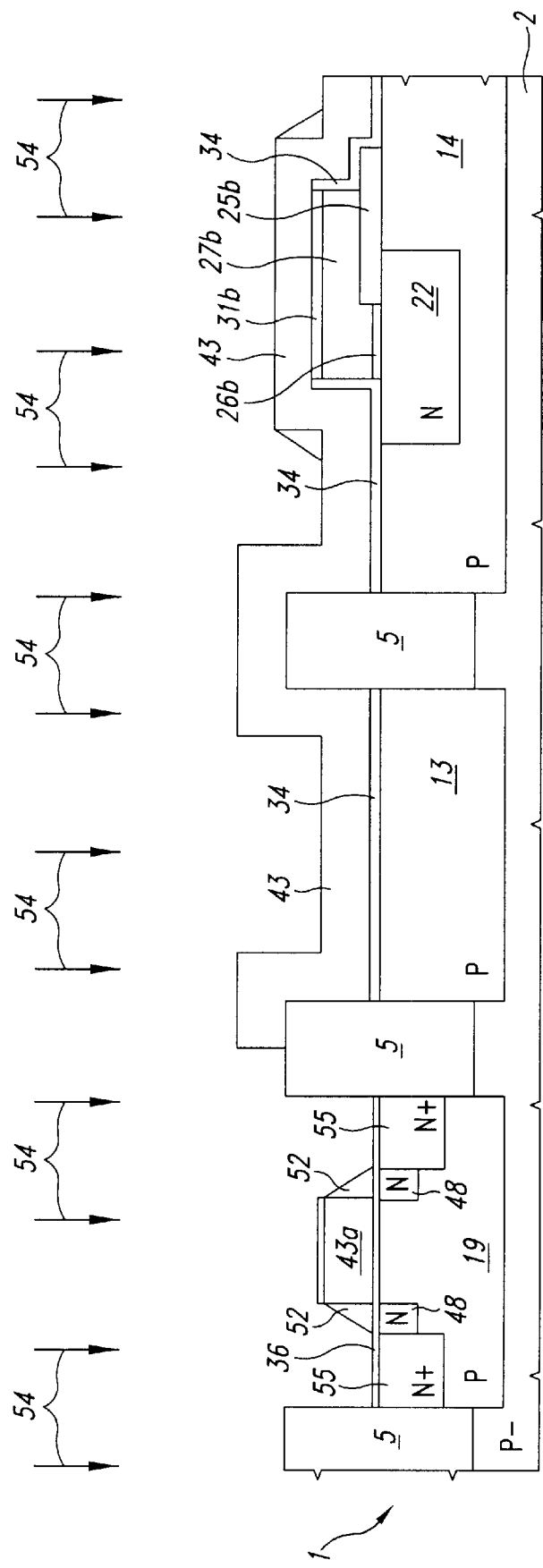

After removing the resist mask (not shown), masked implanting of doping ions of P type is carried out; in particular, during this step, the P-HV 13 regions and P-LV 19 regions, as well as the matrix region 15, are covered, whereas in the N-LV regions, LDD regions of P type (not shown) are formed. On the entire surface of the wafer 1, a dielectric layer (for example TEOS— TetraEthylOrthoSilicate) is then deposited; then, in a known manner, the TEOS layer is subjected to anisotropic etching, therefore it is removed completely from the horizontal portions, and remains laterally to the gate regions 43a, where it forms spacers 52, and partially on the floating gate regions 27b, on the matrix area 15 (FIG. 20). On the other hand, spacers are not formed above the field oxide regions 5, owing to the bird's beak shape of the latter (in a known manner, not shown for simplicity); furthermore, spacers are not formed above the P-HV regions 13 and the respective N-HV regions, since the gate regions of the HV transistors are not yet defined.

Subsequently, using a resist mask (not shown) which covers the N-LV and N-HV regions, doping ions of N type are implanted, as shown in FIG. 20 by arrows 54. LV-NMOS source and drain regions 55 of N+ type are then formed in the P-LV regions 19, in a self-aligned manner with the spacers 52. The LV-NMOS source and drain regions 55 are more highly doped than the LDD regions 48. In addition, the poly2 layer 43 and the gate regions 43a are doped N type, whereas the areas where HV and LV PMOS transistors are to be produced are covered. The structure of FIG. 20 is thus obtained.

After removing the resist mask (not shown), a similar step of masked implanting doping ions of P type is carried out, for forming respective source and drain regions in the N-LV regions (in a not shown manner), and for doping P type the poly2 layer 43, above the N-LV and N-HV regions. In this step, the P-LV regions 19, P-HV regions 13, and P-matrix region 14, are completely covered.

Figure 21:
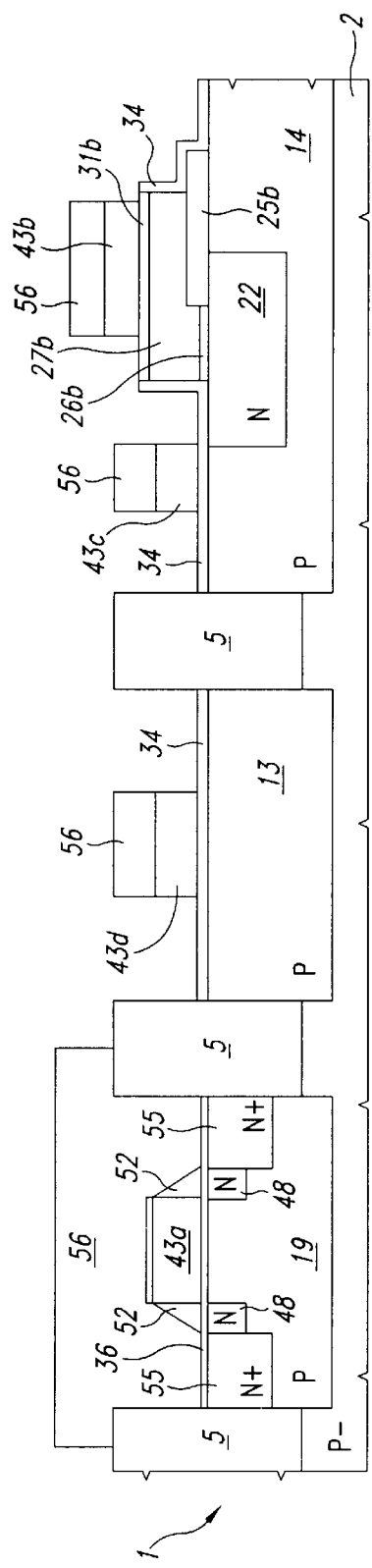
Figure 22:
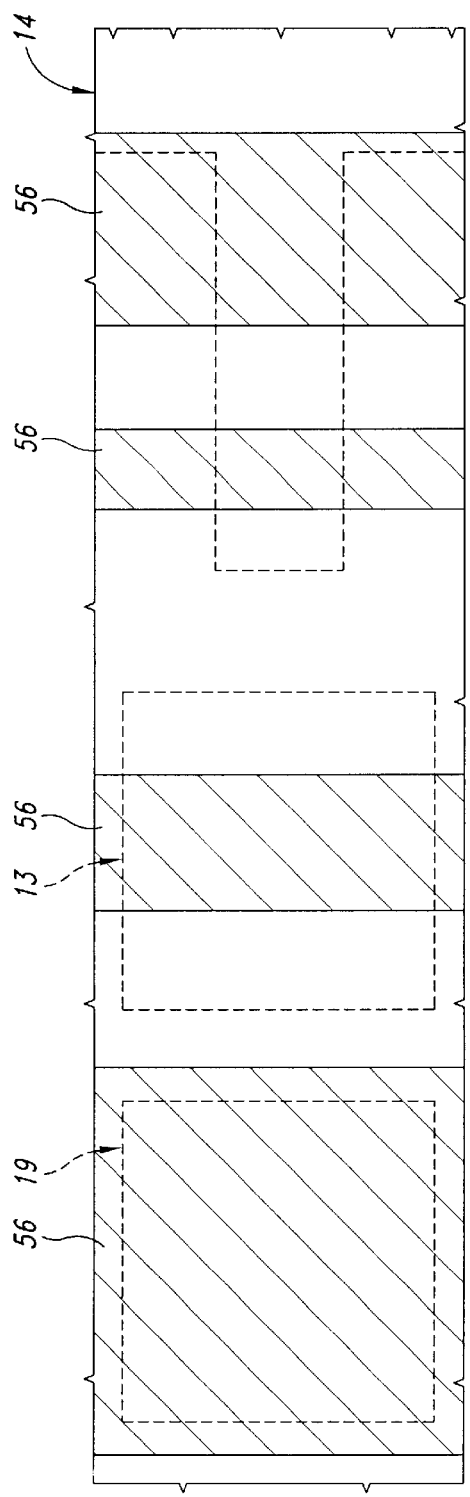
FIG. 22 is a plan view of the wafer of FIG. 21.

Subsequently, an HV gate mask 56 is formed, which covers the surface of the wafer 1, with the exception of the active areas where the gate regions of the high-voltage transistors are to be formed (P-HV regions 13, in the case of HV NMOS), and the portions of the P-matrix region 14 designed to form the gate regions of the selection transistor, and the control gate regions of the memory transistors (in this respect see FIGS. 21 and 22). Then, the portions of poly2 layer 43 not covered by the HV gate mask 56 are etched; the structure of FIG. 21 is thus obtained.

Subsequently, re-oxidation is carried out, forming an oxide layer 57 on the entire free surface of substrate 2, in particular laterally on the floating gate regions 27b and control regions 43b of the memory transistors, and laterally on the gate regions of the selection transistors, as shown in FIG. 23, wherein the gate region of the selection transistor is indicated at 43c, the gate region of the memory transistor is indicated at 43b, and the gate region of the HV NMOS transistor is indicated at 43d.

After removal of the HV gate mask 56 and re-oxidation, an NHV mask (not shown) is formed, covering N-LV and N-HV regions (not shown). Using the NHV mask, doping ions of N type are implanted, as shown schematically in FIG. 23 by arrows 63. In P-HV regions 13, at both sides of HV gate regions 43d, HV-NMOS source and drain regions 64 of N type are then formed, less doped than LV-NMOS source and drain regions 55; simultaneously, in the P-matrix region 14, drain regions 65a of selection transistor are formed, on one side, in a self-aligned manner with the gate regions 43c of the selection transistors, and the source regions 65b of the memory transistor are formed on the side not facing the respective selection transistor, in a aligned manner with the gate region 43b of the memory transistors. In addition, the areas arranged between each selection transistor and the respective memory transistor are also implanted; however, this implanting generally takes place inside the continuity regions 22, more doped, and is therefore not shown (for this reason the respective area is represented with broken lines). However, in case of misalignments, this implanting guarantees electrical continuity. The HV-NMOS source and drain regions 64 of the HV selection transistor 65a, and the source regions 65b of the memory transistor (as well as the regions) have a lower doping level than the LV-NMOS source and drain regions 55, and thus have a higher breakdown voltage and higher resistivity.

After removing the NHV mask, the source and drain regions of the HV PMOS transistors (not shown) are similarly implanted using a mask.

Subsequently a protection dielectric layer 70, for example of TEOS or nitride, is deposited on the entire surface of the wafer 1. A salicide protection mask 72, shown in FIG. 24, is then formed, covering the surface of wafer 1, except the active areas where the low-voltage transistors are formed (P-LV regions 19, for the NMOS). Using the salicide protection mask 72, dielectric layer 70 is removed from above the P-LV regions 19 (FIG. 24). After removing the salicide protection mask 72, if zener diodes, low-doping precision resistors, and/or transistors of N and P type with non-salicided junctions are to be formed, a dielectric layer is deposited and defined using a suitable mask, in a not shown manner. Otherwise, the uncovered poly2 layer are immediately salicided. Saliciding, carried out in a known manner, as previously described, causes titanium silicide regions to form above the source and drain regions of the LV NMOS and PMOS transistors (silicide regions 75a1 above the LV-NMOS source and drain regions 55, and similar regions for the LV PMOS transistors), above the gate regions of the LV NMOS and PMOS transistors (silicide regions 75a2 above the gate regions 43a for the LV NMOS transistors, and similar regions for the LV PMOS transistors), as shown in FIG. 25.

Figure 25:
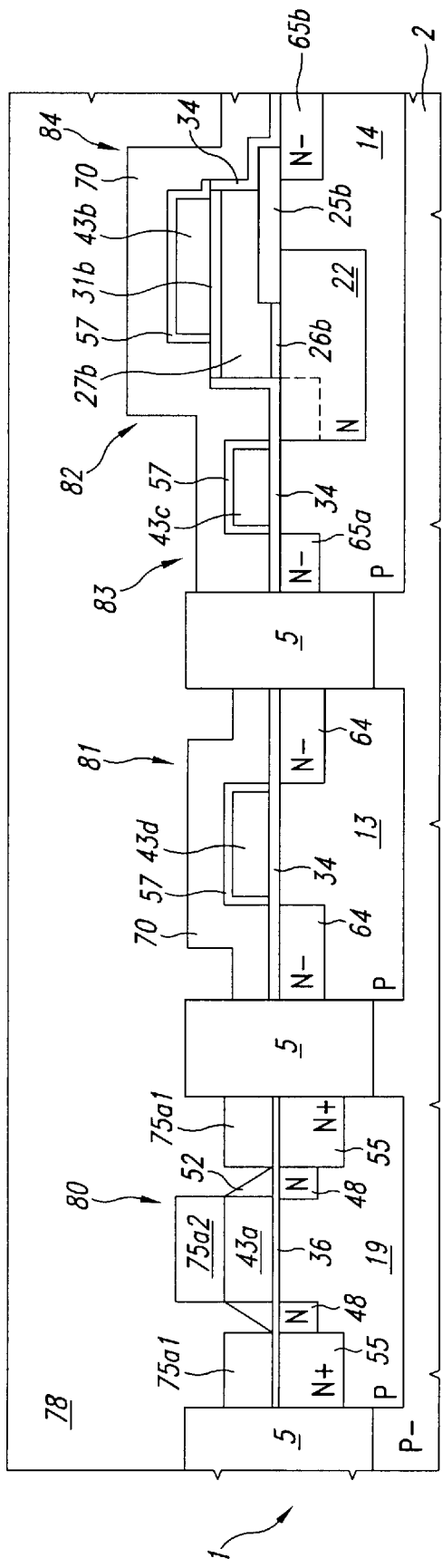

After forming a protection dielectric layer 78, the final structure of FIG. 25 is obtained, showing an LV NMOS transistor 80, an HV NMOS transistor 81, and an EEPROM cell 82, formed by a selection transistor 83 and a memory transistor 84. The final steps follow, including forming contacts and electrical interconnection lines, deposition of a passivation layer, etc.

In the described process, the length of the tunnel area in the horizontal direction of the cross section of FIG. 25, which is equal to the length of the tunnel region 26b, is determined by two different masks, since the left edge of the tunnel region 26b in FIG. 25 is defined by the floating gate mask 30, and the right edge of the tunnel region 26b, delimited by the matrix oxide region 25b, is defined by the matrix oxide mask 24, as is evident from FIG. 11. Consequently, misalignments between the two masks 24 and 30 may affect the dimensions of the tunnel area in the horizontal direction of FIG. 25. The lack of a precise dimensional control over the tunnel area could result in a possible reduction in reliability.

In addition, the above mentioned misalignments determine different variations in the dimensions of the adjacent cells. In a memory array of the described type, adjacent cells (in the horizontal direction of the figures) are arranged alternately in a symmetrical way (in FIG. 2, the adjacent cell to the right of the fully shown cell presents the leg 9a on the left and the cross-piece 9b on the right, whilst the subsequent cell has the same orientation as the shown cell). Consequently, misalignment between the two masks towards the left or towards the right causes alternatively an increase of the length of the tunnel region 26b in one half of the cells and a reduction in the remaining half of the cells. It follows that the electrical characteristics of the memory cells are not uniform, but are of two different types, according to whether a particular cell is "even" or "odd", with a consequent reduction in the reliability of the memory array.

To solve the above problem, another fabrication process is described, and only the steps of the new fabrication different from the previous process are discussed.

In detail, the present fabrication process comprises the initial steps described with reference to FIGS. 1–10 until the interpoly dielectric layer 31 is formed.

Figure 26:
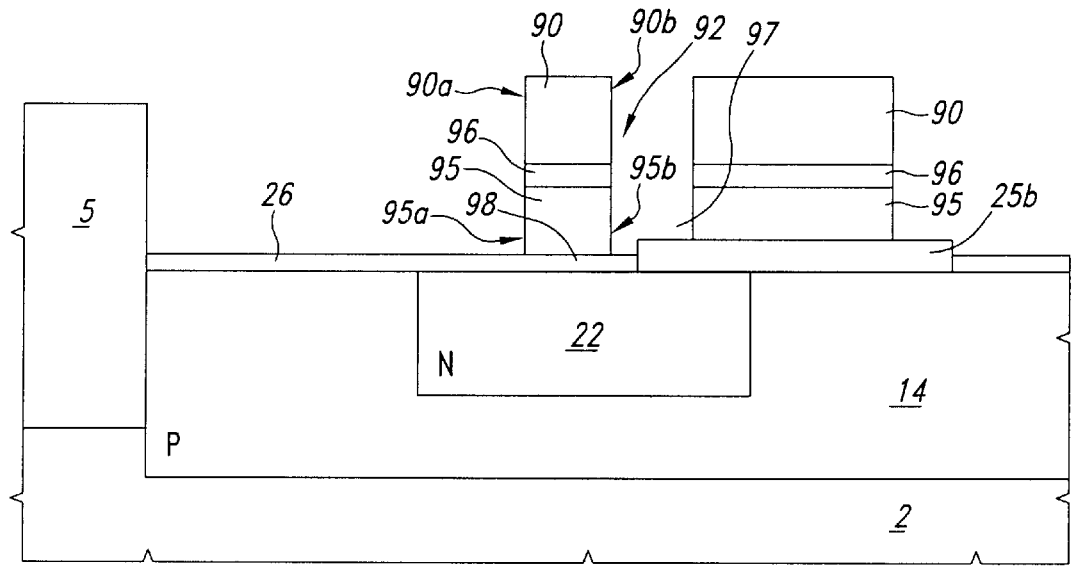
FIG. 26 shows a cross-section through a silicon wafer, in a step of the method according to the invention, for a portion of the wafer housing a memory cell, in enlarged scale.
Figure 27:
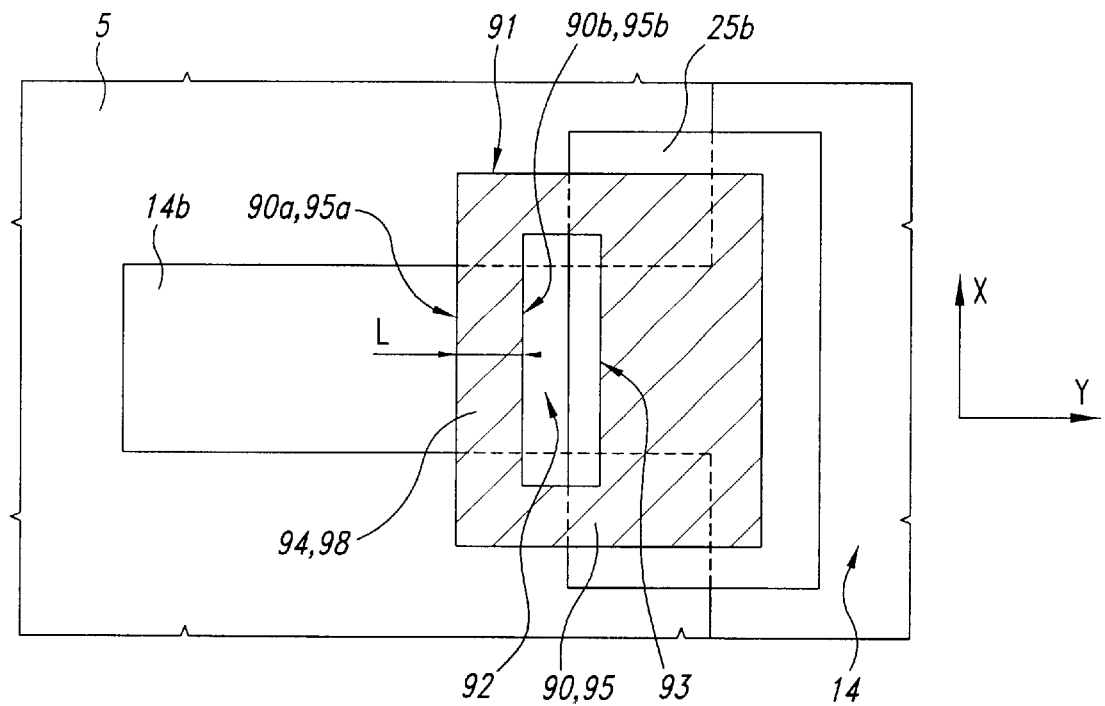
FIG. 27 shows a cross-section similar to that of FIG. 26.

Subsequently, the floating gate mask is formed having a different shape from that previously described, as shown in FIGS. 26 and 27. In detail, in the top view of FIG. 27, the floating gate mask, here indicated by 90, has an external perimetral edge 91 of a rectangular shape, a side 90a of which extends perpendicularly to the cross-piece 14b (parallel to the x axis in FIG. 27), in an approximately central position with respect to the cross-piece 14b itself. The floating mask 90 has an opening 92 delimited by an internal perimetral edge 93. The internal perimetral edge 93 is also rectangular, and its sides are parallel to the sides of the external perimetral edge 91; in particular, a side 90b of the internal perimetral edge 93 facing the side 90a delimits, together with the side 90a itself, a mask portion 94 having a preset width 1 (y direction in FIG. 27) corresponding to the desired width for the tunnel area. The position of the floating gate mask 90 and the size of the opening 92 are chosen so that the left edge of the matrix oxide region 25b (facing the selection transistor, still to be made) falls within the opening 92 even in the event of misalignments, as will be explained in what follows. Preferably, the left edge of the matrix oxide region 25b is set roughly in the center of the opening 92; moreover, the latter has, for example, a width of 0.5 μm (for a 0.35 μm process).

Subsequently, as in the previous process, the interpoly dielectric layer 31 and the poly1 layer 27 are etched in succession. Because of the shape of the floating gate mask 90, these layers are removed also internally, under the opening 92. Consequently, at the end of etching, the floating gate region, now indicated by 95, and the interpoly dielectric region, now indicated by 96, present the same rectangular-hole shape as the mask 90. In particular, the sides of the floating gate region 95 corresponding to the externally delimiting edge 90a and the internally delimiting edge 90b, indicated by 95a and 95b, respectively, define the length of the tunnel area in the y direction, now determined solely by the dimensions of the floating gate mask 90, and namely by the length 1 of the mask portion 94.

The size of the tunnel area in the perpendicular direction (x direction in FIG. 27) is instead determined, as in the prior process, by the width of the cross-piece 14b of the P-matrix region 14 (active area of the cell).

Figure 28:
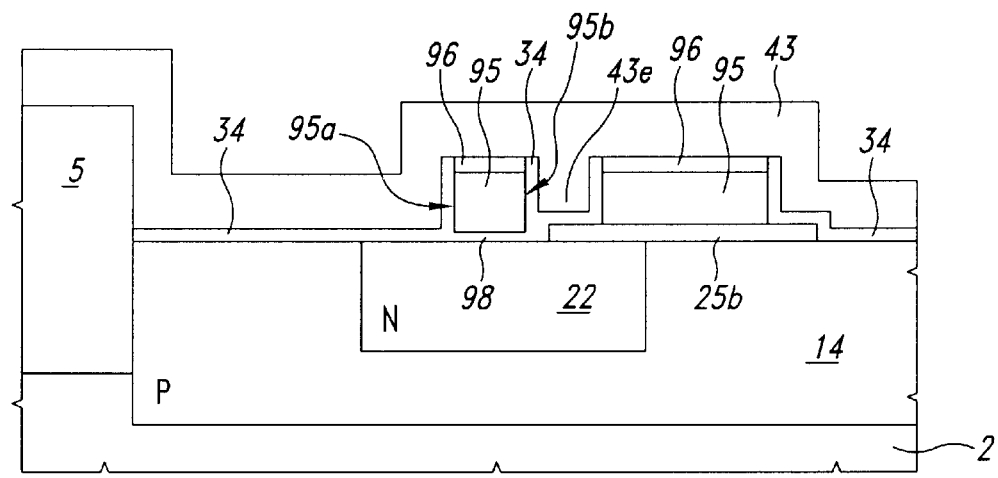
FIGS. 28 and 29 show cross-sections similar to that of FIG. 26, in successive production steps.

In FIG. 28 and in the subsequent figures, the portion of the tunnel layer 26 delimited by the sides 95a and 95b of the floating gate region 95 and making up the tunnel region is indicated by 98.

The manufacturing process then comprises the previously-described steps including a re-oxidation step for completely sealing the floating gate region 95 also inside the hole determined by the opening 92. In particular—see FIG. 28—as for the process described previously, an HV gate oxide layer 34 is grown, joining with the layer 26, the dimensions whereof can be calibrated in a known way. Next, the second polycrystalline silicon layer (poly2 layer, 43) is deposited and fills the hole inside the floating gate region 95, as evident from FIG. 28, where the filling region is indicated by 43e.

Figure 29:
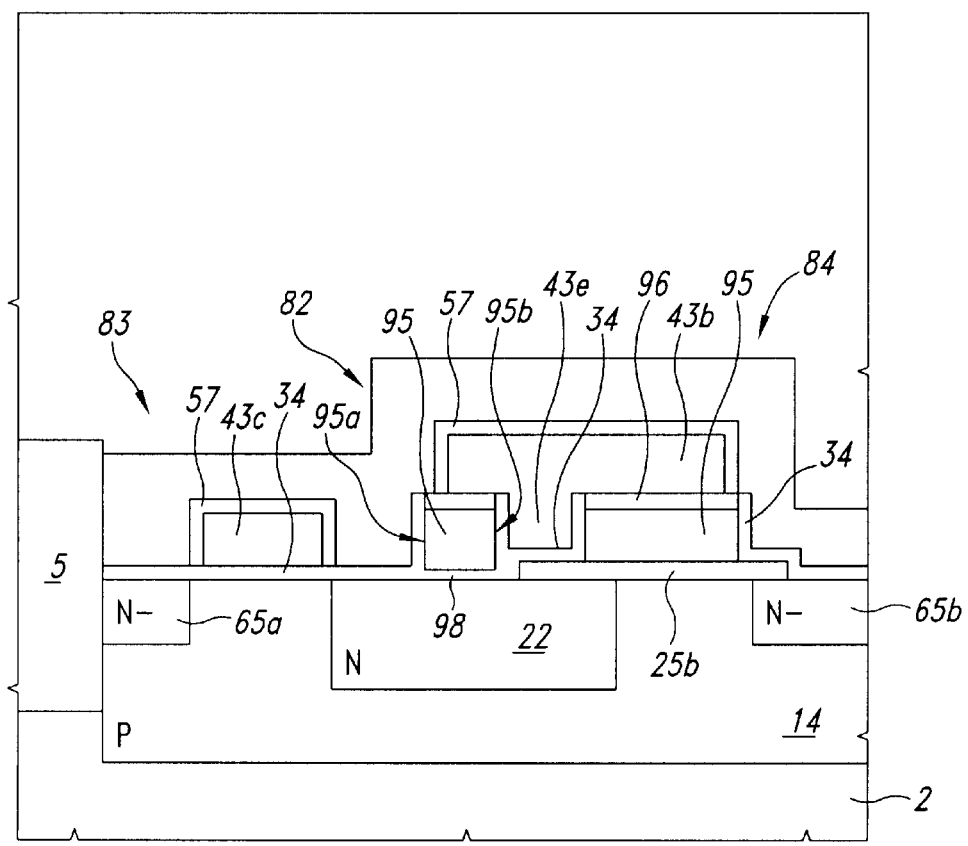

The further steps are then carried out for forming the gate region 43c of the selection transistor 83, forming the P-channel and N-channel HV and LV transistors, and forming the conductive regions 48, 55, 64, 65a, and 65b in the active areas. As regards the memory cell 82, the final structure shown in FIG. 29 is thus obtained.

The thus described method makes it possible to control the dimensions of the tunnel area 98 with a precision that depends only upon the dimensional control of the active area mask 4 and floating gate mask 90, and not upon the misalignments between the masks, which are much harder to control.

In addition, given that the dimensions of the tunnel area 98 do not depend upon the misalignments, the variability of the dimensions of "even" cells and "odd" cells discussed above no longer exists, and hence the memory cells 82 present more uniform electrical characteristics.

The presence of the opening in the floating gate region 95 calls for appropriate re-sizing of the cell. In fact, on the one hand, the area of the floating gate region 95 of the sensing transistor 84 is reduced, and, on the other hand, the coupling surface between the floating gate region 95 and the control gate region 43b increases, on account of the coupling existing between the filling region 43a and the portions of the floating gate region 95 facing it. Consequently, the present memory cell requires, on the whole, a larger area than the prior cell, but presents better electrical characteristics; consequently it may be advantageously applied when the requisites of area occupied are less stringent (for example, but not only, in "embedded" applications), and where it is necessary to have high electrical characteristics and high reliability.

Finally, it is clear that numerous modifications and variations can be made to the method and to the electronic device described and illustrated herein, all of which fall within the scope of the invention, as defined in the attached claims and the equivalents thereof. For example, the tunnel layer 26 may be etched or not during the definition of the floating gate region 95; in addition, instead of being completely inside the floating gate region 95, the hole 97 may face one side of the latter, perpendicular to the side 95b.

Figure 30:
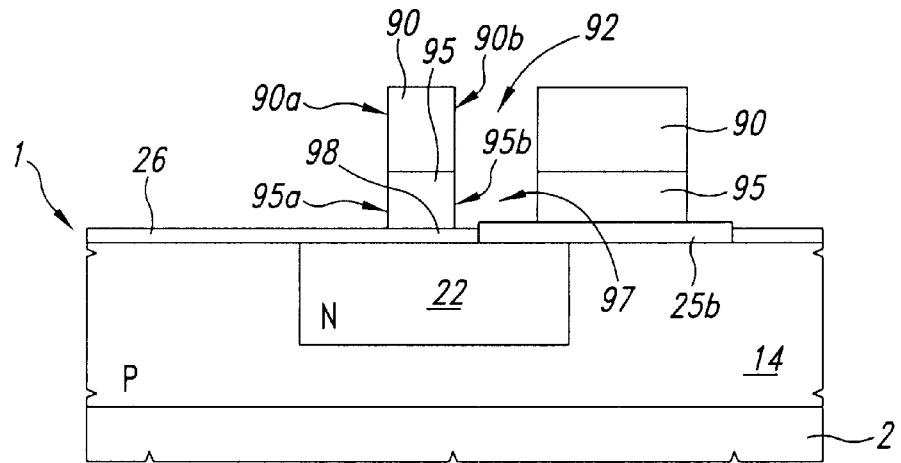
FIGS. 30 and 31 show cross-sections in two subsequent steps for a different embodiment of the invention.
Figure 32:
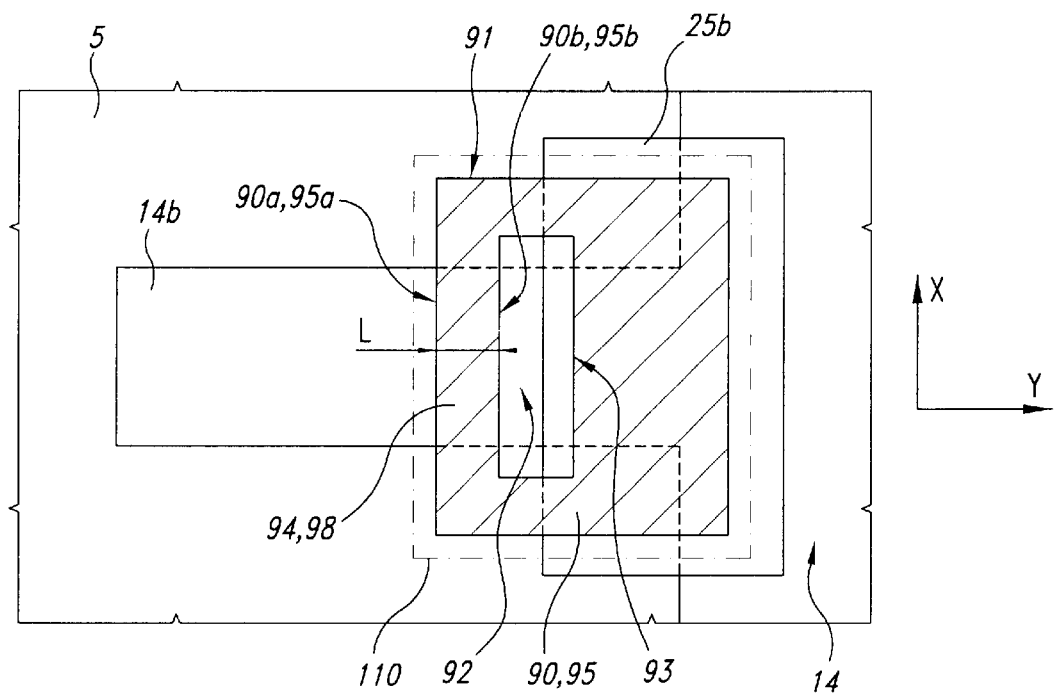
FIG. 32 is a plan view showing part of the masks used in the different embodiment of the process according to the invention.

According to a different embodiment described hereinafter, the interpoly dielectric layer 31 may be deposited and defined in an independent subsequent step, instead of together with the floating gate region 95. In detail, according to this different embodiment, initially the steps described for the prior process with reference to FIGS. 1–9 are carried out, up to depositing the first polycrystalline silicon layer 27. Subsequently, the interpoly dielectric layer 31 is not formed, but the floating gate mask 90 is immediately formed with the same shape as described above, as shown in FIG. 30 and, with top view, in FIG. 32.

Figure 31:
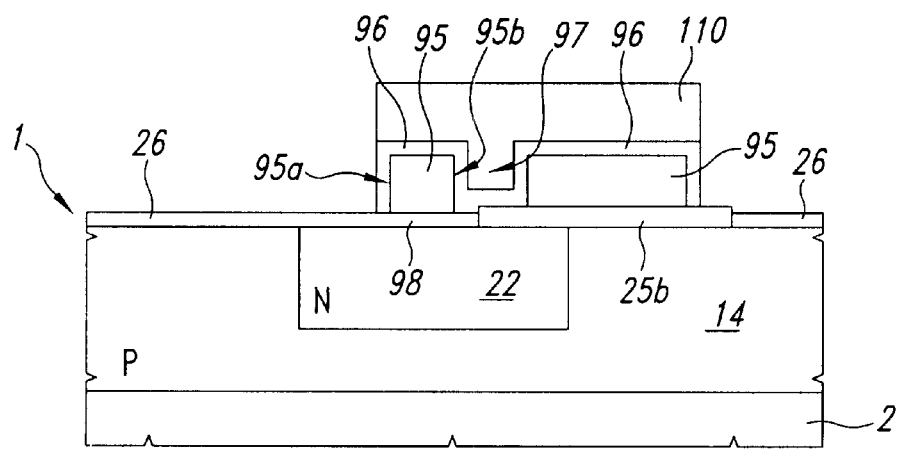

An interpoly dielectric layer 101 is next formed, for example, comprising a triple ONO layer (silicon oxide-silicon nitride-silicon oxide). Then, using an ONO mask 110, indicated in FIG. 32 by the dashed-and-dotted line and having dimensions greater than the external dimensions of the floating gate mask 90, the interpoly dielectric layer 101 is removed everywhere except above and at the sides of the floating gate region 95, so as to seal the floating gate region 95 completely also inside the hole 97, as shown in FIG. 31.

Figure 33:
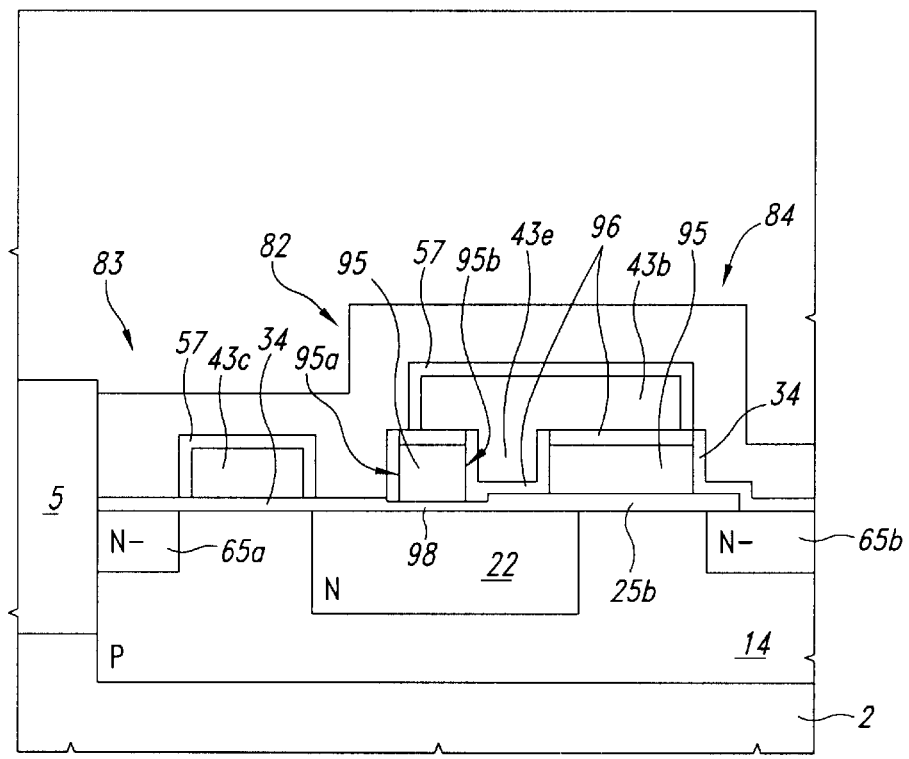
FIG. 33 shows a cross-section, similar to FIG. 31, in a final manufacturing step of a different embodiment of the invention.

Next, the high voltage oxide layer 34 is grown, and the poly2 layer 43 is deposited. Then, subsequent steps are carried out for forming the gate region 43c of the selection transistor 83, forming the P-channel and N-channel HV and LV transistors, and forming the conductive regions 48, 55, 64, 65a, and 65b in the active areas. The final structure of memory cell 32 shown in FIG. 33 is then obtained.

This embodiment has the advantage of insulating the floating gate region 95 better, so that the resulting memory cell becomes more reliable.

What is claimed is:

1. A process for manufacturing electronic devices having floating gate nonvolatile memory cells, comprising:

defining an active area in a substrate of semiconductor material;

forming a first insulating region on top of said active area;

depositing a first dielectric material layer on top of said substrate, said first dielectric material layer comprising a tunnel area;

forming a floating gate region on top of said first dielectric material layer and on top of said first insulating region;

forming a second insulating region surrounding said floating gate region;

forming a control gate region on top of said floating gate region; and forming conductive regions in said active area;

said step of forming a floating gate region comprising the steps of depositing a first semiconductor material layer on top of said dielectric material layer and selectively removing said first semiconductor material layer using a floating gate mask having an externally delimiting side, said floating gate mask having an opening with an internally delimiting side facing said externally delimiting side at a preset distance, and in that selectively removing comprises removing said first semiconductor material layer laterally to said externally and internally delimiting sides.

2. The process of claim 1 wherein forming a floating gate region comprises forming a polygonal region having a hole.

3. The process of claim 1 wherein said floating gate mask has an external perimeter of rectangular shape, and said opening has an internal perimeter of rectangular shape, and said externally delimiting side and said internally delimiting side are parallel to one another, facing one another, and delimit between each other a mask portion defining a length dimension of said tunnel area.

4. The process of claim 1 wherein said opening is arranged laterally to said first insulating region.

5. The process of claim 2 wherein forming a second insulating region comprises forming first sealing portions covering a top surface, and second sealing portions covering at least side walls of said floating gate region that delimit said hole, and forming a control gate region comprises depositing a second semiconductor material layer, said second semiconductor material layer filling said hole in said floating gate region.

6. The process of claim 5 wherein forming a second insulating region comprises depositing a second dielectric material layer on top of said first semiconductor material layer; selectively removing said second dielectric material layer using said floating gate mask, and obtaining said first sealing portions; and forming said second sealing portions.

7. The process of claim 5 wherein forming a second insulating region comprises depositing a second dielectric material layer on top of and at the sides of said floating gate region; and selectively removing said second dielectric material layer from a surface of said substrate, laterally to said floating gate region, thus forming said first and second sealing portions.

8. The process of claim 1 wherein said cell is an EEPROM cell, and wherein the process further comprises forming a selection transistor laterally to and at a distance from said tunnel region.

9. An electronic device comprising a nonvolatile memory element, comprising a substrate of semiconductor material housing an active area; conductive regions in said active area; a first insulating region on top of said active area; a tunnel region, of dielectric material on top of said active area and located laterally to said first insulating region; a floating gate region on top of said tunnel region and said first insulating region; a second insulating region surrounding said floating gate region; and a control gate region on top of said floating gate region, said floating gate region internally presents a hole, and said second insulating region further extends on internally delimiting walls of said hole, and said control gate region comprises a filling portion extending into and covering a bottom of said hole.

10. The device of claim 9 wherein said floating gate region has, in top view, an external perimeter of rectangular shape having an externally delimiting side, and said hole has, in top view, an internal wall of rectangular shape having an internally delimiting side facing said externally delimiting side and parallel thereto.

11. The device of claim 10 wherein said nonvolatile memory element belongs to an EEPROM cell that comprises a selection transistor arranged adjacent to and at a distance from said nonvolatile memory element and facing said tunnel region.

12. A process for manufacturing nonvolatile memory cells with dimensional control of floating gate regions, the process comprising:

forming a floating gate on semiconductor material by depositing and defining a semiconductor material layer through a floating gate mask having an opening with an internally delimiting side extending a preset distance from a corresponding externally delimiting side of the mask; and forming a control gate on top of the floating gate, the control gate extending into and covering a bottom in a hole formed in said floating gate by said opening.

13. The process of claim 12 wherein forming the floating gate comprises removing semiconductor material laterally at the external and internal delimiting sides to define a tunnel area.

14. The process of claim 13 wherein the tunnel area includes a length that is defined by the floating gate mask alone.

15. The process of claim 13, further comprising, prior to forming the floating gate:
 forming a first insulating region on top of an active area; and
 forming a tunnel region lateral to the first insulating region.

16. The process of claim 15 wherein forming the floating gate further comprises sealing the floating gate with an insulating region.

17. The process of claim 12 wherein forming the floating gate comprises:
 depositing a first semiconductor material layer on top of a dielectric material layer; and
 selectively removing the first semiconductor material layer using the floating gate mask, the floating gate mask having an externally delimiting side and an opening with an internally delimiting side facing the externally delimiting side at a predetermined distance.

18. The process of claim 17 wherein selectively removing comprises removing the first semiconductor material lateral to the externally and internally delimiting side.

19. The process of claim 12 wherein forming the floating gate comprises forming a polygonal region having an opening defined by the floating gate mask.

20. The process of claim 19, further comprising depositing a second semiconductor material layer, the second semiconductor material layer filling the hole in the floating gate.

* * * * *